United States Patent
Ota (10) Patent No.: US 9,978,822 B2
(45) Date of Patent: May 22, 2018

(54) ELECTRO-OPTIC DEVICE AND ELECTRONIC APPARATUS

(71) Applicant: SEIKO EPSON CORPORATION, Tokyo (JP)

(72) Inventor: Hitoshi Ota, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 39 days.

(21) Appl. No.: 15/412,605

(22) Filed: Jan. 23, 2017

(65) Prior Publication Data

US 2017/0229528 A1  Aug. 10, 2017

(30) Foreign Application Priority Data

Feb. 9, 2016 (JP) ................. 2016-022428

(51) Int. Cl.
*H01L 27/32* (2006.01)
*H01L 51/52* (2006.01)

(52) U.S. Cl.
CPC ........ *H01L 27/3258* (2013.01); *H01L 27/322* (2013.01); *H01L 27/3211* (2013.01); *H01L 27/3246* (2013.01); *H01L 27/3262* (2013.01); *H01L 27/3272* (2013.01); *H01L 27/3276* (2013.01); *H01L 51/5271* (2013.01)

(58) Field of Classification Search
CPC ............ H01L 27/3258; H01L 27/3211; H01L 27/322; H01L 27/3246; H01L 27/3272
See application file for complete search history.

(56) References Cited

U.S. PATENT DOCUMENTS

2014/0361273 A1* 12/2014 Nozawa ................ H01L 51/524
257/40
2015/0102323 A1  4/2015 Koshihara et al.

FOREIGN PATENT DOCUMENTS

JP  2015-005342 A  1/2015
JP  2015-076300 A  4/2015

* cited by examiner

*Primary Examiner* — Tran Tran
(74) *Attorney, Agent, or Firm* — Oliff PLC (57) ABSTRACT

An electro-optic device includes an element substrate. The element substrate has a display section and a peripheral circuit section. The display section has a plurality of pixels arranged therein. The peripheral circuit section is disposed around the display section and contains peripheral circuits. The display section has, for each pixel, an organic EL element and a transistor for driving the organic EL element. The organic EL element is disposed above the transistor with a light-reflective layer and an insulating layer in between. The insulating layer has a different film thickness in accordance with to the display color of the pixel. An insulating layer in the peripheral circuit section has the same layer structure as the insulating layer having a largest film thickness in the display section.

8 Claims, 6 Drawing Sheets

ELECTRO-OPTIC DEVICE AND ELECTRONIC APPARATUS

BACKGROUND

1. Technical Field

The present invention relates to an electro-optic device and an electronic apparatus.

2. Related Art

A known electro-optic device includes a light-emitting device equipped with a light-emitting element for each of multiple pixels arranged in a display area. In such a light-emitting device, a wire to supply current to an electrode of the light-emitting element is connected so that the light-emitting element can emit light. For example, JP-A-2015-76300 proposes a light-emitting device in which a second electrode and peripheral wiring formed around the display area are connected to enable sufficient conduction between wires to supply current and the second electrode (cathode) of the light-emitting element.

The light-emitting device in JP-A-2015-76300 is configured to appropriately adjust an optical path length between a first power electrical conductor and a second electrode of an optical resonator structure in accordance with the film thickness of an optical path length adjustment layer. This configuration enables a resonance wavelength of light emitted from each pixel to be set for each display color.

The light-emitting device described in JP-A-2015-76300, however, may develop a short circuit between the peripheral wiring and the electrode (anode) or the like of the pixel portion in the case where the optical path length adjustment layer that covers the peripheral wiring is thin. More particularly, in the manufacturing process of the above light-emitting device, a minute foreign substance or dust may mix into the optical path length adjustment layer when a film is formed, thereby causing a short circuit to occur between wires. Such short-circuiting is problematic in that it hinders the light-emitting feature of the light-emitting device, which affects the light-emitting quality of the light-emitting device and leads to reduced yield easily.

SUMMARY

The invention may be applied in the form of embodiments and examples as described below.

APPLICATION EXAMPLE

An electro-optic device according to an aspect of the invention includes a display section in which a plurality of pixels are arranged, a peripheral circuit section containing peripheral circuits that is disposed around the display section, and an element substrate including the display section and the peripheral circuit section. The display section has for each pixel a light-emitting element and a transistor for driving the light-emitting element. The light-emitting element is disposed above the transistor with a light-reflective layer and an insulating layer in between. The insulating layer has a film thickness that differs in accordance with the display color of a pixel and an insulating layer in the peripheral circuit section has a layer structure identical to a layer structure of the insulating layer having a largest film thickness in the display section.

According to this application example, since the film thickness of the insulating layer in the peripheral circuit section is large, an occurrence of a short circuit may be reduced between a peripheral circuit around the display section and a pixel electrode in the display section. More specifically, the insulating layer formed in the light-emitting element serves as an optical path length adjustment layer for light emitted by the light-emitting element. In order to set the resonance wavelength (display color) of the optical resonator structure in response to the display color of a pixel, such as red, green, or blue, for example, the film thickness of the above insulating layer is changed to adjust the optical path length. Thus, it is possible to easily configure the insulating layer in the peripheral circuit section so as to have the same layer structure as the pixel which has the insulating layer having a largest film thickness. This configuration reduces an occurrence of a short circuit between the wires in the peripheral circuit section even when a minute foreign substance or the like mixes into the insulating layer during formation of a film in the manufacturing process. Thus, the light-emitting feature of the light-emitting element is stabilized, and an electro-optic device can be provided with improved light-emitting quality and yield in the manufacturing process.

In the electro-optic device described in the above application example, it is preferable that the light-reflective layer be disposed by being split in each pixel, and that the insulating layer cover the surface on which the light-reflective layer has been disposed, include an insulating film with a depression being formed in a gap between split adjacent light-reflective layers, and include an embedded insulating film that is embedded in the depression.

According to this configuration, the insulating layer covering the adjacent light-reflective layers is planarized in the display section. Accordingly, the smooth insulating layer covering the light-reflective layer may reduce scattering of light to increase the light-emitting efficiency of pixels. The planarized insulating layer enables the optical path length to be adjusted precisely pixel by pixel, thereby improving the color reproducibility of light emission.

In the electro-optic device described in the above application example, it is preferable that the peripheral circuit includes a routed wire having light-blocking properties and being connected to a cathode of the light-emitting element, and the routed wire is formed on the insulating film having the depression.

According to this configuration, the routed wire with light-blocking properties is disposed away from the light-reflective layer by a distance equal to the film thickness of the insulating layer covering the light-reflective layer. Thus, the routed wire can block and reduce scattering of light from the light-reflective layer in light emission by the light-emitting element, thereby improving the contrast of the light-emitting element.

In the electro-optic device described in the above application example, it is preferable that the insulating layer include a plurality of layers composed of different materials.

According to this configuration, materials having a high refractive index and high insulating properties can be used for and incorporated into the insulating layer in the display section. This configuration facilitates adjustment of the optical path length and provides high insulating properties without increasing the film thickness.

An electronic apparatus according to an aspect of the invention includes the electro-optic device described in the above application example.

According to this application example, an electronic apparatus having a light-emitting element with an improved light emission performance can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention are described with reference to the accompanying drawings. In the following drawings, scales different from actual dimensions are used for layers and members so as to make the layers and members large enough to be recognizable.

Embodiment 1

Electro-Optic Device

Figure 1:
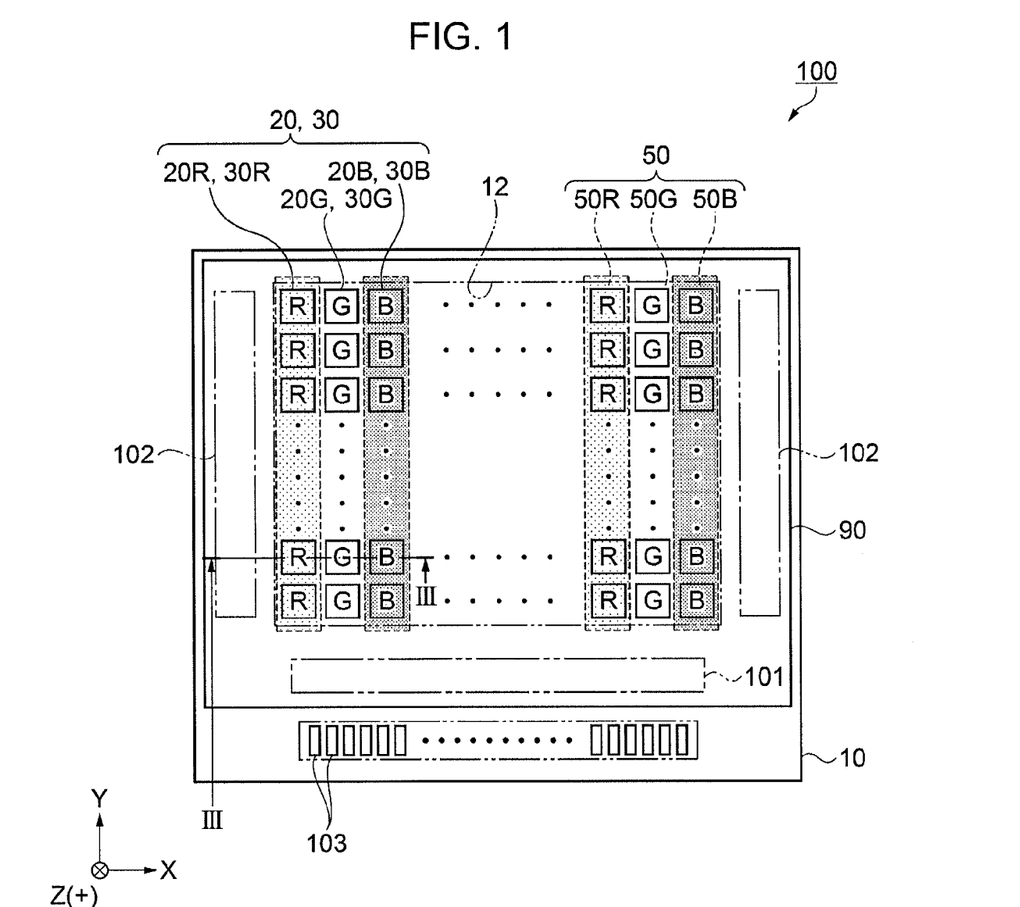
FIG. 1 is a plan view illustrating the structure of an organic EL device according to Embodiment 1 of the invention.

Referring to FIG. 1, an electro-optic device according to this embodiment is described. In this embodiment, an example of an electro-optic device includes an organic electroluminescent (EL) device. FIG. 1 is a plan view illustrating the structure of an organic EL device according to Embodiment 1 of the invention.

As illustrated in FIG. 1, an organic EL device 100 in this embodiment has an element substrate 10 and a counter substrate 90. The element substrate 10 and the counter substrate 90, facing each other, are bonded to each other with a filler layer, which is described later.

Figure 3:
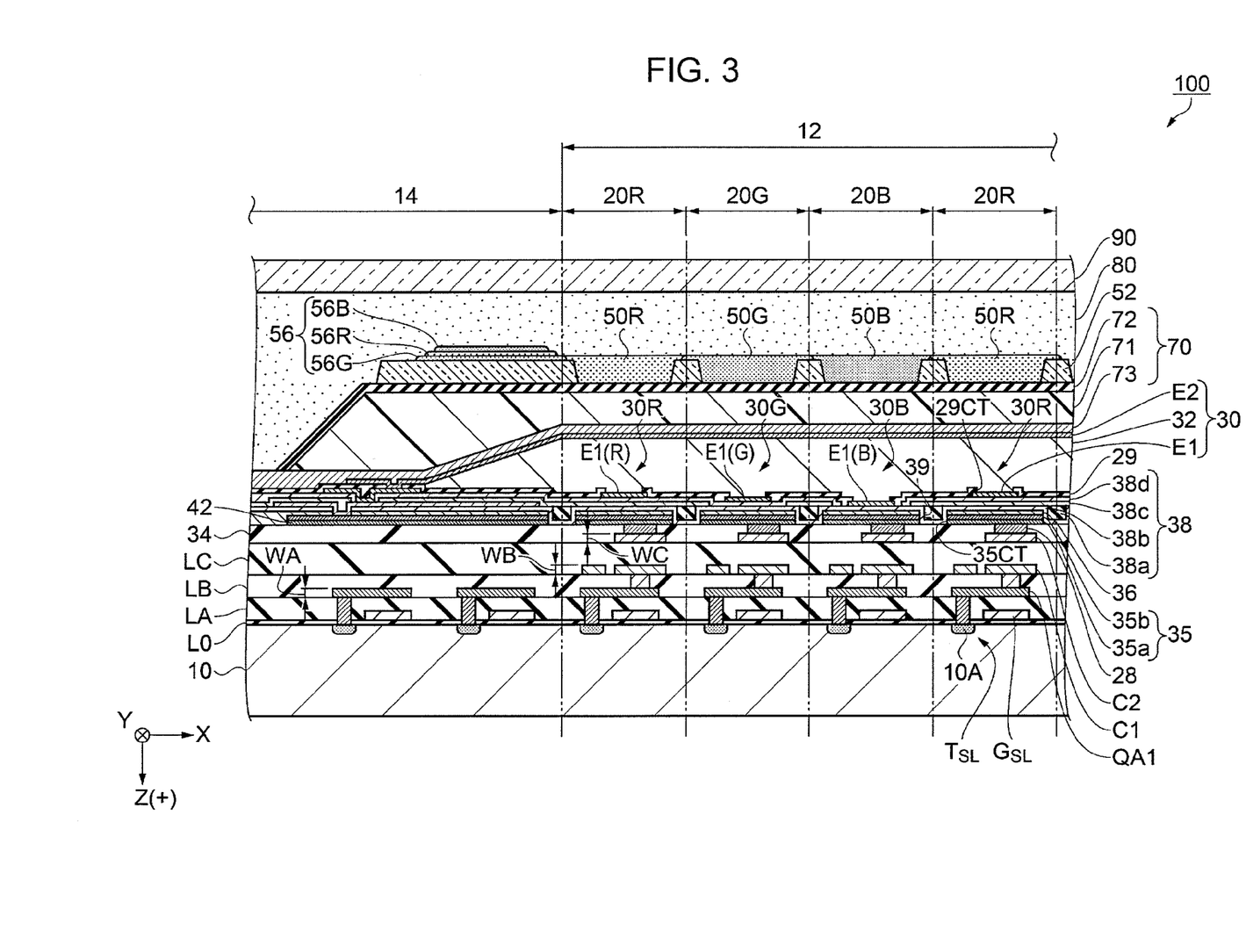
FIG. 3 is a cross-sectional view of the organic EL device taken along a line III-III in FIG. 1.

The element substrate 10 is provided with a display section 12 and a peripheral circuit section 14 (see FIG. 3). The display section 12 has a plurality of pixels 20 arranged therein. An organic EL element 30 is disposed as a light-emitting element for each pixel 20. Specifically, the element substrate 10 includes a pixel 20B in which blue (B) light is obtained, a pixel 20G in which green (G) light is obtained, and a pixel 20R in which red (R) light is obtained. Pixels 20B, pixels 20G, and pixels 20R are arranged in the display section 12 in the form of a matrix. In plan view, or as viewed from the direction which is perpendicular to the surface of the element substrate 10, pixels 20B, pixels 20G, and pixels 20R are all formed in a rectangular shape.

In the organic EL device 100, the pixel 20B, the pixel 20G, and the pixel 20R form a display unit, providing full color display. In some cases in the following explanations, the pixel 20B, the pixel 20G, and the pixel 20R are collectively called the pixels 20. Also, in some cases, organic EL elements 30B, 30G, and 30R disposed to the respective pixels 20B, 20G, and 20R are collectively called the organic EL elements 30.

The display section 12 has a color filter layer 50 disposed therein. With regard to the color filter layer 50, a blue color filter layer 50B is disposed on the organic EL element 30B of the pixel 20B; a green color filter layer 50G is disposed on the organic EL element 30G of the pixel 20G; a red color filter layer 50R is disposed on the organic EL element 30R of the pixel 20R.

In this embodiment, the pixels 20 in which light of the same color is emitted are arranged in the first direction, that is, in the longitudinal direction of the figure, and the pixels 20 in which light of different colors is emitted are arranged in the second direction which is substantially perpendicular to the first direction, that is, in the lateral direction of the figure. Thus, the pixels 20 are arranged in a so-called stripe form. In response to this arrangement of the pixels, the blue color filter layer 50B, the green color filter layer 50G, and the red color filter layer 50R are also arranged in a stripe form. The arrangement of the pixels 20 is not limited to the stripe arrangement described above, and may be a mosaic arrangement or a delta arrangement.

The organic EL device 100 has a top-emitting structure. Accordingly, the white light emitted by the organic EL elements 30 passes through the color filter layer 50 of the element substrate 10 and the light exits the counter substrate 90 as display light (emitted light). Since the organic EL device 100 has this top-emitting type of structure, an opaque ceramic substrate, a semiconductor substrate, or the like may be used as a base material of the element substrate 10 in addition to a transparent quartz substrate, a glass substrate, or the like. In this embodiment, a silicon substrate (semiconductor substrate) is used as the base material of the element substrate 10.

The peripheral circuit section 14 is disposed around the display section 12 in an area at which the counter substrate 90 and the element substrate 10 face each other.

A plurality of external connection terminals 103 are disposed along one longer side of the element substrate 10 outside the peripheral circuit section 14. A data line driving circuit 101 is disposed on the peripheral circuit section 14 between these external connection terminals 103 and the display section 12. A scanning line driving circuit 102 is disposed on the peripheral circuit section 14 between each of the two shorter sides of the element substrate 10 and the display section 12. In the following explanations, the second direction along the longer side of the element substrate 10 is indicated by an X direction, the first direction along the shorter side of the element substrate 10 is indicated by a Y direction, and a direction from the counter substrate 90 toward the element substrate 10 is indicated by a Z (+) direction.

The counter substrate 90, which is smaller than the element substrate 10, is disposed opposite the element substrate 10 so as to expose the external connection terminals 103. The counter substrate 90, having a feature that protects the organic EL elements 30 disposed on the display section 12 from damage, is set to be wider than the display section 12. A plate member having light transmission properties, for example, a quartz substrate, a glass substrate, or the like, may be used for the counter substrate 90.

The external connection terminals 103 are connected to a flexible wiring substrate (not shown). The organic EL device 100 can be electrically connected via the flexible wiring substrate to an external circuit (not shown).

Pixel Circuit

Figure 2:
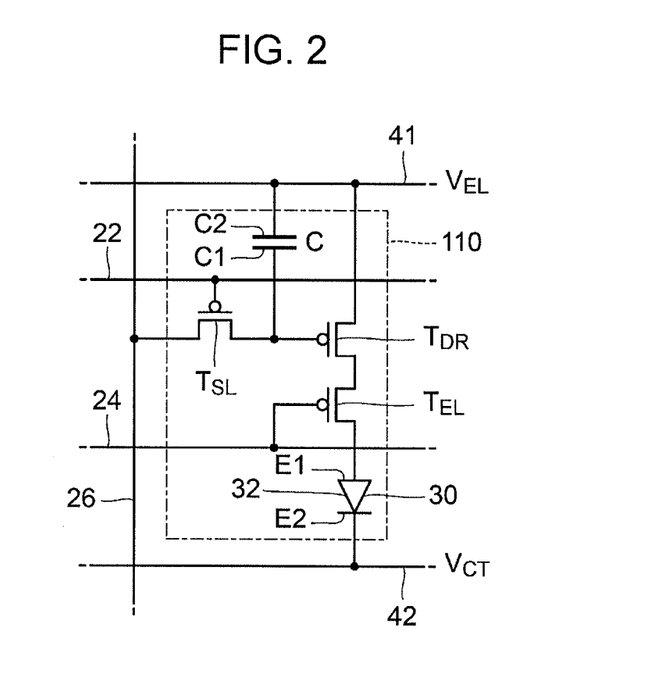
FIG. 2 is an equivalent circuit diagram of a pixel in the organic EL device.

FIG. 2 is an equivalent circuit diagram of a pixel in the organic EL device 100. Each of the pixels 20 in the display section 12 described above has a pixel circuit 110. As illustrated in FIG. 2, each pixel circuit 110 has each organic EL element 30, a driving transistor $T_{DR}$ for driving the organic EL element 30, a light emission control transistor $T_{EL}$, a selector transistor $T_{SL}$, and a capacitor C. In this embodiment, the transistors T ($T_{DR}$, $T_{EL}$, and $T_{SL}$) of the pixel 20 are P-channel type transistors, but they may be N-channel type transistors.

The organic EL element 30 has a first electrode E1 as an anode (pixel electrode) and a second electrode E2 as a cathode (counter electrode) formed facing each other across a light-emitting function layer 32. The first electrode E1 is formed for each pixel 20 and the second electrode E2 is formed across a plurality of pixels 20. The organic EL element 30 is placed on a current path that connects a first wire 41 and a second wire 42. The first wire 41 is a power wire in which a power supply potential (first electrical potential) $V_{EL}$ on the higher side is supplied and the second wire 42 is a power wire in which a power supply potential (second electrical potential) $V_{CT}$ on the lower side is supplied.

The driving transistor $T_{DR}$ and the light emission control transistor $T_{EL}$ are placed in series with the organic EL element 30 on the current path that connects the first wire 41 and the second wire 42. Specifically, one end (a source) of a pair of current ends of the driving transistor $T_{DR}$ is connected to the first wire 41. The light emission control transistor $T_{EL}$ functions as a switch that controls the conduction state (conducting or non-conducting) between the other end (a drain) of the pair of current ends of the driving transistor $T_{DR}$ and the first electrode E1 of the organic EL element 30. The driving transistor $T_{DR}$ generates a drive current in an amount in accordance with a voltage across its own gate-source. When the light emission control transistor $T_{EL}$ is controlled to be in the on state, the generated drive current is supplied from the driving transistor $T_{DR}$ through the light emission control transistor $T_{EL}$ to the organic EL element 30, which emits light with brightness in accordance with the amount of drive current. When the light emission control transistor $T_{EL}$ is controlled to be in the off state, supply of the drive current to the organic EL element 30 is stopped and the organic EL element 30 turns off. The gate of the light emission control transistor $T_{EL}$ is connected to a control line 24.

The selector transistor $T_{EL}$ functions as a switch that controls the conduction state (conducting or non-conducting) between a signal line 26 and the gate of the driving transistor $T_{DR}$. The gate of the selector transistor $T_{EL}$ is connected to a scanning line 22. The capacitor C exhibits a capacitance with a dielectric material interposed between a first electrode C1 and a second electrode C2. The first electrode C1 is connected to the gate of the driving transistor $T_{DR}$ and the second electrode C2 is connected to the first wire 41 (the source of the driving transistor $T_{DR}$). Thus, the capacitor C maintains the voltage across the gate-source of the driving transistor $T_{DR}$.

The data line driving circuit 101 (see FIG. 1) described above supplies, to a plurality of signal lines 26, a gray scale potential (data signal) according to a gray scale specified for each pixel 20 (see FIG. 1) by an image signal supplied from an external circuit during each write period (horizontal scanning period). Each of the scanning line driving circuits 102 (see FIG. 1) selects each of the scanning lines 22 in sequence during each write period by supplying a scanning signal to each scanning line 22. The selector transistor $T_{EL}$ of the pixel 20 corresponding to the scanning line 22 selected by the scanning line driving circuit 102 enters the on state. Thus, the gray scale potential is supplied through the signal line 26 and the selector transistor $T_{EL}$ to the gate of the driving transistor $T_{DR}$ of each pixel 20, with the voltage in accordance with the gray scale potential maintained by the capacitor C. When the selection of the scanning line 22 during the write period ends, each scanning line driving circuit 102 supplies a control signal to each control line 24 so that the light emission control transistor $T_{EL}$ of each pixel 20 corresponding to the control line 24 can be controlled to be in the on state. Accordingly, the drive current in accordance with the voltage maintained by the capacitor C during the previous write period is supplied from the driving transistor $T_{DR}$ through the light emission control transistor $T_{EL}$ to the organic EL element 30. As described above, each organic EL element 30 emits light with brightness in accordance with the gray scale potential, enabling an image specified by the image signal to be displayed on the display section 12.

Structure of the Organic EL Device

Next, referring to FIG. 3, the structure of the display section 12 in the organic EL device 100 is described. FIG. 3 is a cross-sectional view of the organic EL device 100 taken along a line III-III in FIG. 1.

As illustrated in FIG. 3, in the organic EL device 100, a plurality of insulating layers and electrode wires, the organic EL elements 30, the color filter layer 50, and the like are formed between the element substrate 10 and the counter substrate 90. Here, for convenience of explanation, in the cross-section of the organic EL device 100, the Z (+) direction corresponds to a downward direction and the Z (−) direction corresponds to an upward direction.

The pixels 20B, 20G, and 20R disposed on the display section 12 have the organic EL elements 30B, 30G, and 30R, respectively. A pixel defining layer 29 is disposed between the organic EL elements 30B, 30G, and 30R. The pixel defining layer 29 includes an insulating material and provides electrical insulation between the adjacent organic EL elements 30B, 30G, and 30R. In this embodiment, the pixel defining layer 29 is, for example, formed as a silicon dioxide ($SiO_2$) film having a thickness of 25 nm. The pixel defining layer 29 is disposed so as to cover the peripheral portion of the first electrode E1 in the organic EL elements 30B, 30G, and 30R. That is, the pixel defining layer 29 has an opening 29CT that exposes part of the first electrode E1 of the pixels 20B, 20G, and 20R. The opening 29CT, being formed to be rectangular in plan view, defines a light-emitting area of each pixel 20.

The pixels 20B, 20G, and 20R are formed by stacking an light-reflective layer 35, a high-reflectivity layer 36, an insulating layer 38, the first electrode E1 which is light transmissive, the light-emitting function layer 32, and the second electrode E2 which is semi-transmissive and reflective, on an insulating interlayer 34 that covers the transistors T ($T_{DR}$, $T_{EL}$, and $T_{SL}$) of the pixel circuit 110, the wires connected to the transistors T ($T_{DR}$, $T_{EL}$, and $T_{SL}$) and the like. This structure is called the optical resonator structure (cavity structure).

The optical resonator structure enables light emitted by the light-emitting function layer 32 to be repeatedly reflected between the light-reflective layer 35 and the second electrode E2 by adjusting an optical path length (optical distance) between the light-reflective layer 35 and the second electrode E2. This repeated reflection enables the light to exit with a higher intensity at a specific wavelength (resonance wavelength). The adjustment of the optical path length is described later.

The insulating interlayer 34 is formed on the bottom surface of the light-reflective layer 35. Further below, a multi-layer wiring layer is formed between the insulating interlayer 34 and the element substrate 10. The multi-layer wiring layer has a plurality of wiring layers W (WA, WB, and WC) and a plurality of insulating layers L (L0, LA, LB, and LC) that provide insulation among these layers W (WA, WB, and WC). The insulating layer L0 is disposed on the surface of the element substrate 10. An inorganic insulating material, such as a silicon compound typified by silicon nitride or silicon oxide, is used to form the insulating interlayer 34 and these insulating layers L. A low-resistance, conductive material, including aluminum, silver, or the like, is used to form these wiring layers W. In the following explanations, the phrase "be formed from the same layer" is used when selective removal is made in a conductive layer (single layer or multi-layer) to form a plurality of components in the same one process by one operation.

The transistors T ($T_{DR}$, $T_{EL}$, and $T_{SL}$) of the pixel 20 are formed on the element substrate 10. In FIG. 3, the selector transistor $T_{SL}$ is illustrated. In addition, an active area 10A (source and drain areas) of each transistor T is also formed. Ions are implanted into the active area 10A. The active layer of the transistors T ($T_{DR}$, $T_{EL}$, and $T_{SL}$) into which ions of a different type to those in the active area 10A are implanted is located between the source area and the drain area. The active layer is omitted in the figure for convenience. The surface of the element substrate 10 on which the active area 10A is formed is coated with an insulating film L0 (gate insulating film). Gates G ($G_{DR}$, $G_{EL}$, and $G_{SL}$) of each transistor T are formed on the surface (upper surface) of the insulating film L0. In FIG. 3, the gate $G_{SL}$ is illustrated. The gates G of the transistors T face the active layer across the insulating film L0.

The insulating layer LA is disposed on the surface of the insulating film L0 on which the gates G of the transistor T are formed. On the surface of the insulating layer LA, conductive patterns, including the scanning line (not shown), the control line 24 (not shown), a relay electrode QA1, and the like, are formed from the same layer (the wiring layer WA). The relay electrode QA1 is a wire that connects the active area 10A of the selector transistor $T_{SL}$ and the gate $G_{DR}$ (not shown) of the driving transistor $T_{DR}$ (not shown) to each other.

The insulating layer LB is formed on the surface of the insulating layer LA on which the wiring layer WA is formed. The first electrode C1 and other components are disposed on the surface of the insulating layer LB. In addition, on the surface of the insulating layer LB, conductive patterns, including the signal lines, relay electrodes other than the relay electrode QA1, and the like, which are not illustrated in FIG. 3, are formed from the same layer (the wiring layer WB).

The insulating layer LC is formed on the surface of the insulating layer LB on which the wiring layer WB is formed. On the insulating layer LC, conductive patterns, including the second electrode C2 and the like, are formed from the same layer (the wiring layer WC). In plan view, the second electrode C2 is disposed at a position and in a shape similarly to the first electrode C1. The first electrode C1, the second electrode C2, and the insulating layer LC make up the capacitor C.

The insulating interlayer 34 is formed on the surface of the insulating layer LC on which the wiring layer WC is formed. Planarization is preferably performed on the upper surface of the insulating interlayer 34. A known surface treatment method such as chemical mechanical polishing (CMP) may be used for a planarization process. Conductive patterns, including the light-reflective layer 35, the second wire 42, and the like, are formed on the upper surface of the insulating interlayer 34, which is highly planarized by the planarization process. For each pixel 20, the insulating interlayer 34 has a first contact electrode 28 formed through the insulating interlayer 34. A conductive material, such as tungsten, titanium, or titanium nitride, for example, may be used to form the first contact electrode 28.

The light-reflective layer 35, by being split for the pixels 20, is disposed for each of the pixels 20B, 20G, and 20R. That is, as described above, each organic EL element 30 is disposed above the corresponding transistors T with the light-reflective layer 35, the insulating layer 38, and the insulating layers L in between. A gap 35CT is disposed between the adjacent light-reflective layers 35 to electrically separate the pixels 20, enabling a different electrical potential to be applied.

The light-reflective layer 35, which includes a conductive material having light reflecting properties, is formed to be rectangular in plan view. The light-reflective layer 35 has a larger footprint than the first electrode E1 and defines a reflecting area in each pixel 20. In this embodiment, the light-reflective layer 35 has two layers: a first layer 35a (lower) and a second layer 35b (upper). A titanium film of 30 nm in thickness is formed as the first layer 35a on the surface of the titanium film, and an alloy film, having a film thickness of 100 nm, of aluminum and copper is formed as the second layer 35b.

In this embodiment, the light-reflective layer 35, which is formed so as to function as the first wire 41 (see FIG. 2) described above, is electrically connected to the second electrode C2 via the first contact electrode 28 which is through the insulating interlayer 34. More specifically, the first layer 35a of the light-reflective layer 35 is connected to the first contact electrode 28.

The high-reflectivity layer 36 serves to enhance the reflecting properties of the light-reflective layer 35. The high-reflectivity layer 36 is disposed to cover the surface of the light-reflective layer 35. An insulating material having light transmissivity may be used for the high-reflectivity layer 36. In this embodiment, the high-reflectivity layer 36 is formed as a silicon oxide film of 40 nm in thickness.

The insulating layer 38 is disposed to cover portions of the insulating interlayer 34 and the surface of the high-reflectivity layer 36. In addition, the first electrode E1 is formed on the surface of the insulating layer 38. The insulating layer 38 includes an embedded insulating film 38a, an optical path length adjustment layer 38b, an optical path length adjustment layer 38c, and an optical path length adjustment layer 38d.

The optical path length adjustment layer 38b as the insulating film having a depression is disposed on portions of the insulating interlayer 34 and the surface of the high-reflectivity layer 36 and is also formed along the inner surface of the gap 35CT. Thus, the optical path length adjustment layer 38b includes a depression 39 corresponding to the gap 35CT. The embedded insulating film 38a is formed to embed the depression 39. This configuration enables the optical path length adjustment layer 38b and the embedded insulating film 38a to be planarized on the surface in contact with the optical path length adjustment layer 38c.

The optical path length adjustment layer 38c and the optical path length adjustment layer 38d are formed on the surfaces of the optical path length adjustment layer 38b and the embedded insulating film 38a. The optical path length adjustment layers 38b, 38c, and 38d, which are part of the insulating layer 38, are configured in such a manner that the above-described optical path length is adjusted between the light-reflective layer 35 and the second electrode E2 for each of the pixels 20B, 20G, and 20R.

The optical path length increases in order of the pixel 20B, the pixel 20G, and the pixel 20R. In the pixel 20B, the optical path length adjustment layers 38c and 38d are omitted and only the optical path length adjustment layer 38b is disposed so that the resonance wavelength (peak wavelength with peak luminance) is, for example, 470 nm. In the pixel 20G, the optical path length adjustment layers 38b and 38d are disposed so that the resonance wavelength is, for example, 540 nm. In the pixel 20R, the optical path length adjustment layers 38b, 38c, and 38d are disposed so that the resonance wavelength is, for example, 610 nm. Thus, in this embodiment, the optical path length is the largest and the film thickness of the insulating layer 38 formed is the largest for the pixel 20R. In this way, depending on whether or not the optical path length adjustment layers 38b, 38c, and 38d are disposed, the film thickness of the insulating layer 38 differs in accordance with the display color of each pixel 20 and the above optical path length is adjusted. Adjustment of the optical path length is also dependent on the film thickness of the high-reflectivity layer 36; the above-described values of the resonance wavelength are set with the film thickness of the high-reflectivity layer 36 also considered.

The pixel 20B emits blue (B) light with the peak wavelength being 470 nm, the pixel 20G emits green (G) light with the peak wavelength being 540 nm, and the pixel 20R emits red (R) light with the peak wavelength being 610 nm. In the organic EL device 100, the above organic EL elements 30 having the optical resonator structure can emit the display color (emitted light) from each pixel 20 with high color purity and improved color reproduction.

In this embodiment, the insulating layer 38 other than the optical path length adjustment layer 38b is formed using the same material. Specifically, silicon nitride (e.g., an 80-nm-thick film) is used for the optical path length adjustment layer 38b, and silicon oxide is used for the embedded insulating film 38a, the optical path length adjustment layer 38c, and the optical path length adjustment layer 38d. The optical path length adjustment layer 38c is formed, for example, to be a film of 40 nm in thickness and the optical path length adjustment layer 38d is formed, for example, to be a film of 50 nm in thickness.

Since silicon nitride has a lower etching rate than silicon oxide, silicon oxide can be selectively etched with respect to silicon nitride in a dry etching process that uses fluorine gas. Thus, at least an end portion of the optical path length adjustment layer 38c or the optical path length adjustment layer 38d is disposed to be positioned on the surface of the optical path length adjustment layer 38b. The optical path length adjustment layer 38b can therefore function as an etching stopper for the optical path length adjustment layer 38c or the optical path length adjustment layer 38d.

The light-emitting function layer 32 is formed to cover the surfaces of the first electrode E1 and the pixel defining layer 29. The light-emitting function layer 32 includes the light-emitting area formed using an organic EL material to emit light with current supply. Of the light-emitting function layer 32, an area inside each opening 29CT of the pixel defining layer 29, the area being between the first electrode E1 and the second electrode E2, is the light-emitting area. In other words, the above light-emitting area functions as the organic EL element 30, and the first electrode E1 corresponds to the anode and the second electrode E2 corresponds to the cathode.

The first electrode E1, which is formed using a conductive material, is light transmissive. The second electrode E2 is semi-transmissive and reflective, meaning that it allows part of light reaching the surface to pass through and reflects the rest of the light. These properties are desired for the above-described optical resonator structure. A conductive material, for example, indium tin oxide (ITO) or the like, may be used to form the first electrode E1. A light-reflective, conductive material, for example, an alloy containing silver and magnesium, may be used to form a thin film for the second electrode E2.

A sealing layer 70 having light transmissivity is formed on the surface of the second electrode E2. The sealing layer 70 covers the entire surface of the second electrode E2 to planarize the surface and at the same time acts as a passivation film to suppress the entry of moisture, oxygen, and the like into the organic EL elements 30. The sealing layer 70 includes a first sealing layer 71, a second sealing layer 72 and a third sealing layer 73, which are stacked from the surface of the second electrode E2 upward in order of the third sealing layer 73, the first sealing layer 71, and the second sealing layer 72.

The third sealing layer 73 is formed to come into contact with the upper surface of the second electrode E2 across the entire area from the display section 12 to the peripheral circuit section 14. The third sealing layer 73 is formed to be a film on the order of about 200 nm to 400 nm in thickness by using an inorganic insulating material, such as a silicon compound or the like. Plasma chemical vapor deposition (CVD), electron cyclotron resonance (ECR) plasma sputtering, ion plating, or other high-density plasma film formation methods may be used to form the third sealing layer 73. An inorganic oxide containing a metal oxide, such as titanium oxide, may be used to form the third sealing layer 73.

The first sealing layer 71, which is wider than the area of the light-emitting function layer 32, is continuously formed on the surface of the third sealing layer 73. The thickness of the first sealing layer 71 formed is on the order of about 2 to 3 μm, which is thicker than the third sealing layer 73 and the second sealing layer 72. The first sealing layer 71 can be formed by a known application method using a polymer having light transmissivity, for example, an epoxy resin, an acrylic resin, or the like.

The second sealing layer 72 coats the area including the display section 12 and the peripheral circuit section 14. The second sealing layer 72 is formed to be a film on the order of about 300 nm to 700 nm in thickness by using an inorganic material excellent in terms of water resistance and heat resistance. A material to form the second sealing layer 72 includes silicon nitride, silicon oxide, silicon oxynitride, or the like. The second sealing layer 72 can be formed in the same manner as the above-described third sealing layer 73.

The color filter layer 50 is formed on the surface of the sealing layer 70. The color filter layer 50 includes banks 52 and a protective portion 56 in addition to the color filter layers 50B, 50G, and 50R described above. The banks 52, which are formed by using a material having light transmission properties, separate the color filter layers 50B, 50G, and 50R for the corresponding pixels 20 to form partitions.

The color filter layer 50 transmits light of a specific wavelength. The color filter layer 50B transmits blue light with a wavelength of about 470 nm, the color filter layer 50G transmits green light with a wavelength of about 540 nm, and the color filter layer 50R transmits red light with a wavelength of about 610 nm.

The protective portion 56 and a portion of the bank 52 are formed like a frame, in plan view, in the peripheral circuit section 14 so as to entirely surround the display section 12, and the protective portion 56 is disposed above the bank 52. The protective portion 56 has three protective layers: 56G, 56R, and 56B. A material to form the protective layer 56G is the same as that for the color filter layer 50G, a material to form the protective layer 56R is the same as that for the color filter layer 50R, and a material to form the protective layer 56B is the same as that for the color filter layer 50B. Thus, when external light is directed onto the peripheral circuit section 14, entry of the external light is reduced, and it is less likely that an observer will perceive external light being reflected by a routed wire, described later. In this embodiment, the protective portion 56 is configured so that the protective layers 56G, 56R, and 56B are stacked in this order upward from the bank 52, but the invention is not limited to this configuration. The protective portion 56 may be formed with at least one of the protective layers 56G, 56R, and 56B, and the above-described order of stacking can also be changed.

The counter substrate 90 described above is bonded on the surface of the color filter layer 50 by using a filler layer 80. The filler layer 80 is formed by applying an adhesive or the like, such as a resin having curing properties, on the surface of the color filter layer 50. The adhesive can be applied by using a known method, preferably by a spin coating method among others. The adhesive to be used may include a known adhesive that may be cured by thermal curing, electron radiation curing, ultraviolet curing, or the like. Such adhesives include, for example, epoxy resins, acrylic resins, and the like.

Figure 4:
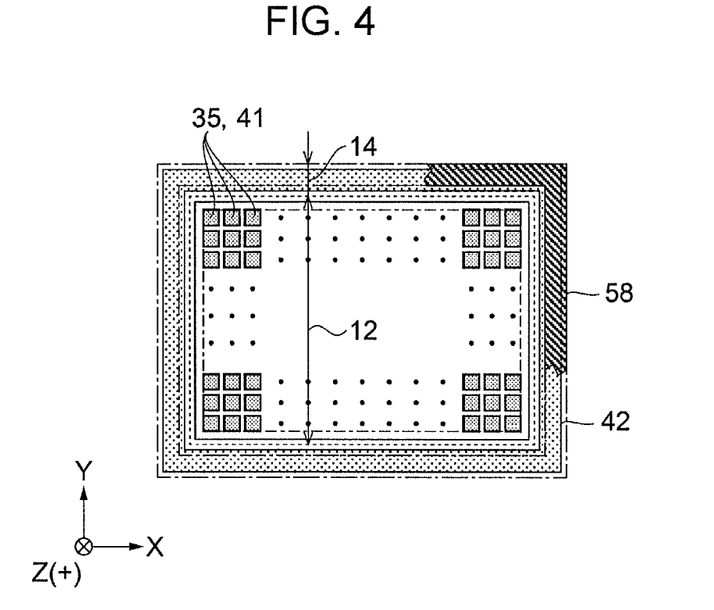
FIG. 4 is a plan view illustrating the arrangement of a light-reflective layer and a second wire.

FIG. 4 is a plan view illustrating the arrangement of the light-reflective layer 35 and the second wire 42. The light-reflective layer 35 illustrated in FIG. 4 is, as described above, part of the optical resonator structure and is also the first wire 41 in which the first electrical potential $V_{EL}$ is supplied. The light-reflective layer 35 is split by the gap 35CT (see FIG. 3) so as to be substantially rectangular and is disposed entirely across the display section 12. The second wire 42, which is disposed in the peripheral circuit section 14, is the power wire in which the second electrical potential $V_{CT}$ is supplied. As illustrated in FIG. 4, the second wire 42 is, in plan view, formed as a rectangle surrounding the light-reflective layer 35 (the display section 12). The width (the distance from the inner perimeter edge to the outer perimeter edge) of the second wire 42 is, for example, 1.5 mm. In plan view, the boundary between the display section 12 and the peripheral circuit section 14 is located at an area surrounded by the perimeter edge of the display section 12 and the inner perimeter edge of the second wire 42.

As illustrated in FIG. 4, a second electrical conductor 58 is disposed in the area that substantially matches the second wire 42. The second electrical conductor 58 (the first wire) is formed on the surfaces of the light-reflective layer 35 and the second wire 42. In FIG. 4, some parts of the second electrical conductor 58 are illustrated by the solid line and other parts of the outline are illustrated by the dash-dot line. The second electrical conductor 58 is, in plan view, formed as a rectangular frame similarly to the second wire 42. The inner perimeter edge of the second electrical conductor 58 is shifted slightly to the outside from the inner perimeter of the second wire 42 and the outer perimeter of the second electrical conductor 58 is shifted slightly to the outside from the outer perimeter of the second wire 42.

Structure of the Peripheral Circuit Section

Figure 5:
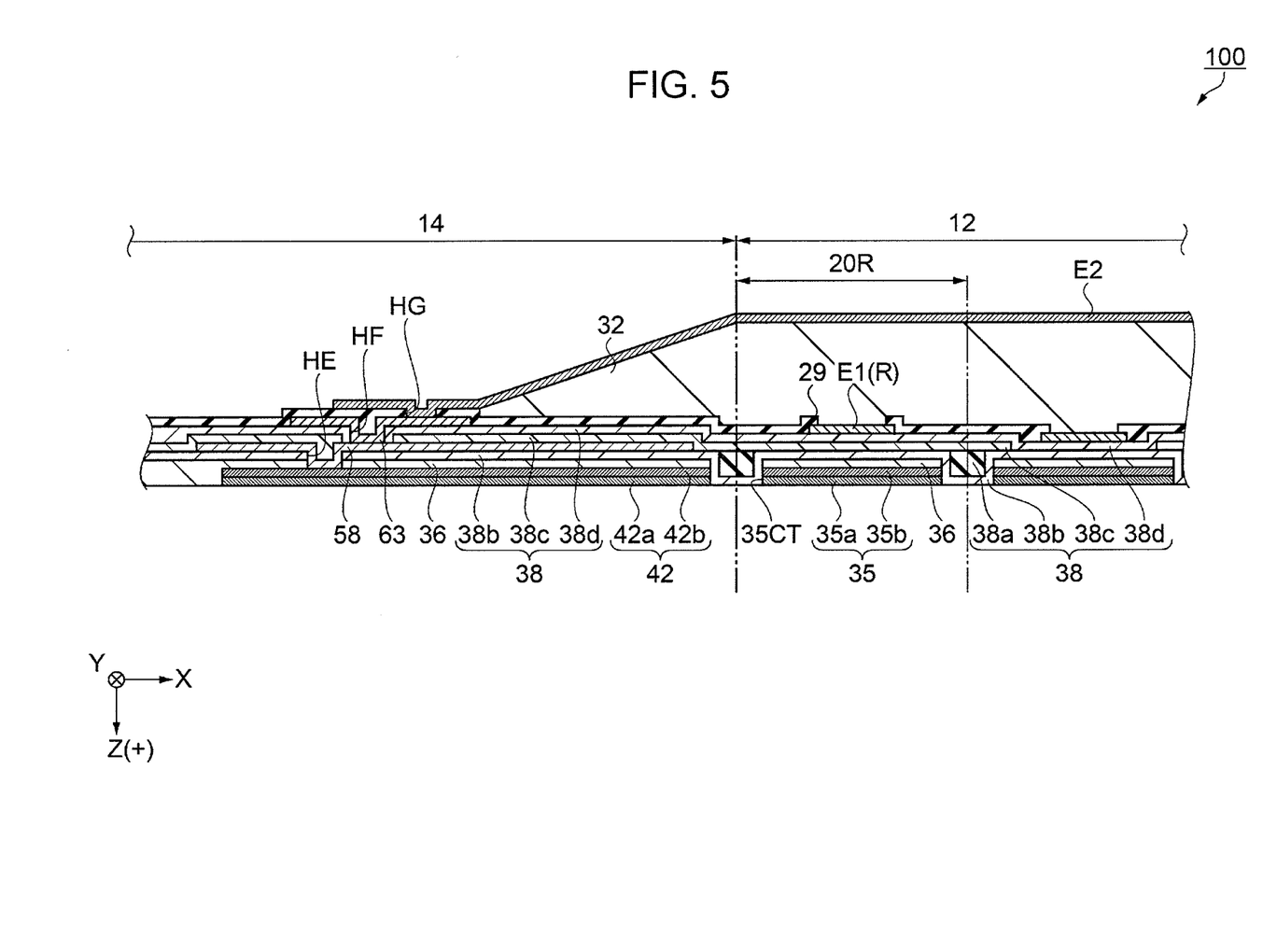
FIG. 5 is a partially enlarged cross-sectional view of FIG. 3.

Next, referring to FIG. 5, the structure of the peripheral circuit section 14 in the organic EL device 100 is described. FIG. 5 is a partially enlarged cross-sectional view of FIG. 3. With regard to the organic EL device 100 illustrated in FIG. 5, the configuration between the second wire 42 and the second electrode E2 is illustrated in the Z direction, and the peripheral circuit section 14 and the pixel 20R in the display section 12 adjacent to the peripheral circuit section 14 are illustrated in the X direction.

The peripheral circuit section 14 includes a first electrical conductor 63, the second electrical conductor 58, the second wire 42, and other peripheral circuits as the routed wire. The high-reflectivity layer 36, the insulating layer 38, and the pixel defining layer 29 are formed above the second wire 42 of these peripheral circuits similarly to the display section 12. The insulating layer 38 in the peripheral circuit section 14 has the same layer structure as the insulating layer 38 of the pixel 20R having the largest film thickness in the display section 12. That is, the insulating layer 38 in the peripheral circuit section 14 also includes the optical path length adjustment layers 38b, 38c, and 38d.

The second electrode E2 disposed in the display section 12 extends to the peripheral circuit section 14. The light-emitting function layer 32 under the second electrode E2 is formed to be thinner starting approximately from a boundary point between the display section 12 and the peripheral circuit section 14. Thus, the second electrode E2 is formed with a slope in the X direction. The second electrode E2 makes contact with the surface of the pixel defining layer 29 under the light-emitting function layer 32 at a position where the layer thickness of the light-emitting function layer 32 becomes zero.

A conductive hole HG, which is through the pixel defining layer 29, is formed on an area where the second electrode E2 and the pixel defining layer 29 come into contact with each other. The second electrode E2 extends along the inner surface of the conductive hole HG to the layer under the pixel defining layer 29. The first electrical conductor 63 is formed on an area under the pixel defining layer 29 where the conductive hole HG is disposed. The second electrode E2 is thus electrically connected via the conductive hole HG to the first electrical conductor 63.

The first electrical conductor 63 can be formed in the same manner and using the same material as the first electrode E1. The optical path length adjustment layers 38c and 38d are disposed under the first electrical conductor 63. A conductive hole HF is formed on the optical path length adjustment layers 38c and 38d at a position not overlapping the conductive hole HG. The first electrical conductor 63 extends along the inner surface of the conductive hole HF to the layer under the optical path length adjustment layers 38c and 38d. The second electrical conductor 58 is formed under the optical path length adjustment layers 38c and 38d. The first electrical conductor 63 is thus electrically connected via the conductive hole HF to the second electrical conductor 58.

The second electrical conductor 58 is formed under the optical path length adjustment layer 38c and also on the optical path length adjustment layer 38b as the insulating film having the depression. That is, the optical path length adjustment layers 38c and 38d are above the second electrical conductor 58. A low-resistance, conductive material, including aluminum, silver, or the like, may be used to form the second electrical conductor 58. Preferably, a material having light-blocking properties is used, or it is preferable to form a film having a thickness enough to have a shielding effect. The second electrical conductor 58 with light-blocking properties can block and reduce scattering of light occurring when light emitted by the organic EL elements 30 is reflected by the light-reflective layer 35.

The optical path length adjustment layer 38b and the high-reflectivity layer 36 are disposed between the second electrical conductor 58 and the second wire 42, where the optical path length adjustment layer 38b is disposed under the second electrical conductor 58 and the high-reflectivity layer 36 is disposed on the second wire 42. The optical path length adjustment layer 38b and the high-reflectivity layer 36 are formed so as to extend from the display section 12. In addition, the gap 35CT is also disposed between the peripheral circuit section 14 and the display section 12 to electrically disconnect the second wire 42 and the light-reflective layer 35.

A conductive hole HE is formed on the optical path length adjustment layer 38b and the high-reflectivity layer 36 at a position not overlapping the conductive hole HF. The second electrical conductor 58 is formed along the inner surface of the conductive hole HE, reaching the under-layer, the second wire 42. The second electrical conductor 58 is thus electrically connected via the conductive hole HE to the second wire 42. In the above-described configuration, the second electrode E2 acts as part of the peripheral circuits. That is, the second electrode E2 is electrically connected to the first electrical conductor 63, the second electrical conductor 58, and the second wire 42.

The second wire 42 can be formed in the same manner and using the same material as the light-reflective layer 35. In this embodiment, similarly to the light-reflective layer 35, the second wire 42 is formed on the surface of the insulating interlayer 34 (see FIG. 3), having two layers: a first layer 42a and a second layer 42b. Each layer is formed by using the same material as the first layer 35a and the second layer 35b of the light-reflective layer 35.

As described above, the electro-optic device according to this embodiment has the following advantages:

(1) Compared with cases where the insulating layer 38 is formed of any one of the optical path length adjustment layers 38b, 38c, and 38d, in the organic EL device 100 in this embodiment, the insulating layer 38 in the peripheral circuit section 14 can be formed to have a thick film. Such a configuration can suppress an occurrence of a short circuit between the first electrical conductor 63, the second electrical conductor 58, the second wire 42, or another peripheral circuit in the peripheral circuit section 14 and the first electrode E1 or the like in the display section 12. More specifically, by setting the optical resonator structure in the pixels 20, the film of the insulating layer 38 between the light-reflective layer 35 and the first electrode E1 in the pixel 20R is thicker than the corresponding films in the pixels 20B and 20G. Introducing this structure of the insulating layer 38 in the pixel 20R also into the peripheral circuit section 14 can result in the above peripheral circuits being placed much further away from the first electrode E1 or the like than ever before. An occurrence of a short circuit is therefore suppressed between the wires even when a minute foreign substance or the like mixes into the insulating layer 38 or the like during formation of a film in the manufacturing process. Thus, the light-emitting feature of the light-emitting element is stabilized, and the organic EL device 100 can be provided with improved light-emitting quality and yield in the manufacturing process.

(2) Setting the optical resonator structure in the pixels 20 enables the film thickness of the insulating layer 38 on the light-reflective layer 35 to be adjusted. Such adjustment involves enabling the adjustment of the optical path length of light emitted by light emission of the organic EL elements 30, whereby the wavelength of the light emitted can be adjusted.

(3) Since the optical path length adjustment layer 38b and the embedded insulating film 38a planarize the insulating layer 38 covering the light-reflective layer 35, the light-reflective layer 35 becomes smoother, improving reflective efficiency. In addition, with regard to light emitted by light emission of the organic EL elements 30, the optical path length can be adjusted precisely for each pixel 20, thereby improving the color reproducibility of light emission in the display section 12.

(4) The second electrical conductor 58 having light-blocking properties is disposed away from the light-reflective layer by a distance equal to the film thickness of the insulating layer 38 covering the light-reflective layer 35. Thus, this configuration blocks and reduces scattering of light reflected from the light-reflective layer 35, thereby improving the contrast of light emission. In addition, configuring the insulating layer 38 in the peripheral circuit section 14 to be the same as the insulating layer 38 in the display section 12 reduces the number of film formation steps in the manufacturing process, enabling simplification of the process.

Embodiment 2

Electronic Apparatus

Figure 6:
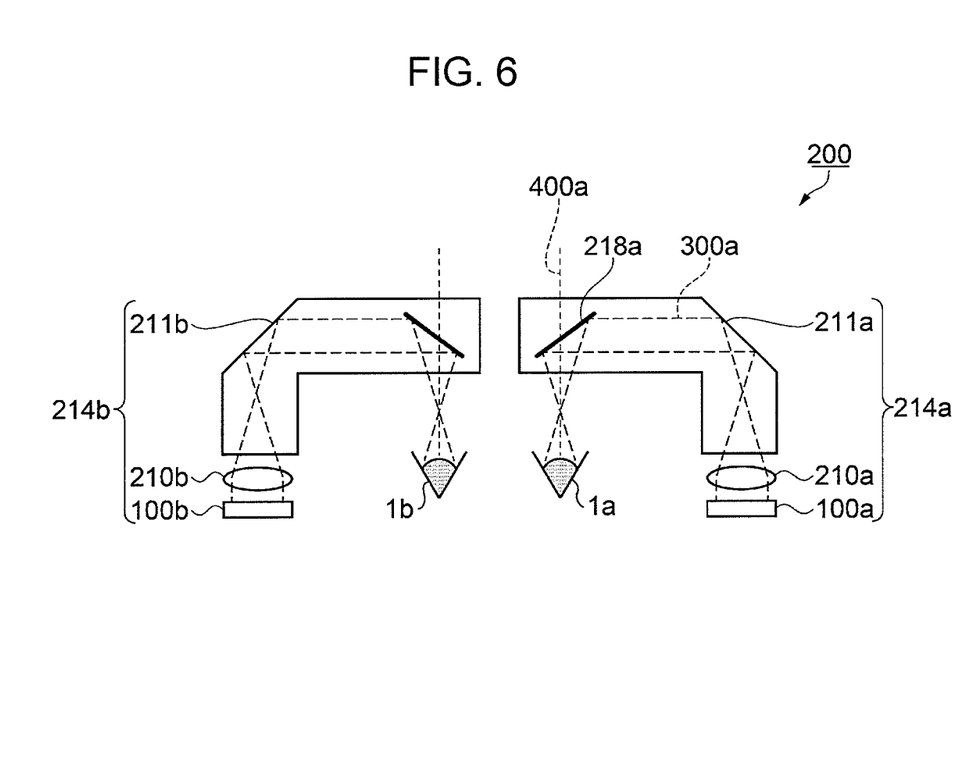
FIG. 6 is a schematic view illustrating the optical structure of a head-mounted display according to Embodiment 2 of the invention.

Referring to FIG. 6, an electronic apparatus according to this embodiment is described. In this embodiment, an example of an electronic apparatus includes a head-mounted display, hereinafter referred to as HMD, equipped with an organic EL device. FIG. 6 is a schematic view illustrating the optical structure of a head-mounted display according to Embodiment 2 of the invention.

An HMD200 is, as illustrated in FIG. 6, a see-through type with which a user can visually recognize both the display of the HMD200 and an outside scene. The HMD200 includes a pair of optical units 214a and 214b to display information, a temple section mounted on the head (not shown), a power supply and a control section (not shown), etc. In the HMD200, the optical units 214a and 214b display various information visible to the user's eyes. The user can visually recognize such information and the outside scene (view) at the same time. Here, the optical units 214a and 214b are configured to be bilaterally symmetrical, so the right-side optical unit 214a is used as an example for descriptions.

The optical unit 214a includes an organic EL device (panel) 100a, a focusing optical section 210a, a light guide unit 211a, and a half mirror layer 218a. They are disposed adjacent to each other in this order. The optical unit 214a, which forms a projector, projects light emitted by the organic EL device 100a onto the half mirror layer 218a disposed before a right eye 1a.

The light guide unit 211a is a quadrangular-prism lens (rod lens), forming a rod integrator. The light guide unit 211a is disposed next to the focusing optical section 210a. This arrangement is configured so that the above rod lens can receive a pencil of light projected from the focusing optical section 210a. In addition, the half mirror layer 218a integrated into the light guide unit 211a is set at an angle, facing the right eye 1a. More specifically, the half mirror layer 218a has an angle to reflect the pencil of light, which is projected from the focusing optical section 210a and has reached through refraction and reflection inside the rod lens, toward the right eye 1a.

The organic EL device 100a displays a display signal transmitted from the control section (not shown) as information. The displayed information is then projected as emitted light onto the focusing optical section 210a. The focusing optical section 210a forms a virtual image from the emitted light (a real image) of the organic EL device 100a and projects the image as information light 300a onto the end of the light guide unit 211a.

In the light guide unit 211a, the information light 300a (pencil of light) projected is transmitted to the half mirror layer 218a through total reflection on the inner surface.

The half mirror layer 218a reflects the information light 300a to guide the information toward the right eye 1a (a pupil) and at the same time transmits outside scene light 400a so as to reach the right eye 1a. This means that the user can visually recognize both the outside scene and the information displayed on the HMD200 while overlapping them.

As described above, the optical unit 214b for a left eye 1b also has an organic EL device 100b; the configuration and feature are the same as those for the above right-side optical unit 214a.

As described above, the electronic apparatus according to this embodiment has the following advantages:

According to this embodiment, an electronic apparatus excellent in terms of the display quality of information or the like can be provided. More specifically, providing the organic EL devices 100a and 100b with stabilized light-emitting quality of the light-emitting element and improved yield in the manufacturing process can improve reliability in the information display function of the electronic apparatus.

The HMD200 to which the organic EL device 100 in this embodiment is applied is of a binocular type having the pair of optical units 214a and 214b, but is not limited to this configuration, and may be a configuration having, for example, one optical unit 214a. In addition, the HMD200 is not limited to a see-through type, and may be an immersive type that can visually recognize the display with external light blocked.

The invention is not limited to the embodiments described above; a variety of modifications and variations may be made to the embodiments. Modifications of the invention are described with reference to modified examples below.

Modified Example 1

In descriptions of the organic EL elements 30 in the above embodiments, white-light emission is assumed, but the color of light emitted is not limited to white. For example, an organic EL element may be configured to emit light with a desired color for each of the pixels 20B, 20G, and 20R. According to this configuration, in addition to the advantages in the above embodiments, the color filter layer 50 can be removed.

Modified Example 2

The light-reflective layer 35 in the above embodiments is assumed to be formed using the first wire 41, but it is not limited to this configuration. In addition to the first wire 41, an electrically independent light-reflective layer may be disposed, for example, between the element substrate 10 and the first electrode E1. According to this configuration, the light-reflective layer can be formed substantially across the entire area in the display section, that is, continuously across the surface 12, without the need to split the light-reflective layer pixel by pixel.

Modified Example 3

The electronic apparatus in the above embodiments is described using the HMD as an example, but electronic apparatuses and electronic components equipped with the inventive electro-optic device can be applied also in other fields.

For example, electronic components include electronic viewfinders. Applying the inventive electro-optic apparatus to electronic viewfinders stabilizes the function of displaying images and the like. Incorporating such electronic viewfinders into electronic apparatuses can improve reliability in the information display function.

The entire disclosure of Japanese Patent Application No. 2016-022428, filed Feb. 9, 2016 is expressly incorporated by reference herein.

What is claimed is:

1. An electro-optic device comprising:
    a display section in which a plurality of pixels are arranged;
    a peripheral circuit section containing a peripheral circuit, the peripheral circuit section being disposed around the display section; and
    an element substrate having the display section and the peripheral circuit section, wherein
    the display section includes, for each pixel, a light-emitting element and a transistor for driving the light-emitting element,
    the light-emitting element is disposed above the transistor with a light-reflective layer and an insulating layer in between,
    the insulating layer has a film thickness that differs in accordance with a display color of each pixel, and
    an insulating layer in the peripheral circuit section has a layer structure identical to a layer structure of the insulating layer having a largest film thickness in the display section.

2. The electro-optic device according to claim 1, wherein
    the light-reflective layer is disposed by being split in each pixel and
    the insulating layer covers a surface on which the light-reflective layer has been disposed, includes an insulating film having a depression formed in a gap between split adjacent light-reflective layers, and includes an embedded insulating film that is embedded in the depression.

3. The electro-optic device according to claim 2,
    wherein the peripheral circuit includes a routed wire having light-blocking properties and being connected to a cathode of the light-emitting element, and
    the routed wire is formed on the insulating film having the depression.

4. The electro-optic device according to claim 1,
    wherein the insulating layer include a plurality of layers composed of different materials.

5. An electronic apparatus comprising the electro-optic device according to claim 1.

6. An electronic apparatus comprising the electro-optic device according to claim 2.

7. An electronic apparatus comprising the electro-optic device according to claim 3.

8. An electronic apparatus comprising the electro-optic device according to claim 4.

* * * * *